United States Patent
Hou et al.

(10) Patent No.: US 9,865,690 B2
(45) Date of Patent: Jan. 9, 2018

(54) METHODS FOR FABRICATING A METAL STRUCTURE FOR A SEMICONDUCTOR DEVICE

(71) Applicants: Liping Daniel Hou, Torrance, CA (US); Chuanxin Lian, Torrance, CA (US)

(72) Inventors: Liping Daniel Hou, Torrance, CA (US); Chuanxin Lian, Torrance, CA (US)

(73) Assignee: Qorvo US, Inc., Greensboro, NC (US)

( * ) Notice: Subject to any disclaimer, the term of this patent is extended or adjusted under 35 U.S.C. 154(b) by 592 days.

(21) Appl. No.: 13/852,346

(22) Filed: Mar. 28, 2013

(65) Prior Publication Data

US 2013/0267085 A1 Oct. 10, 2013

Related U.S. Application Data

(60) Provisional application No. 61/622,065, filed on Apr. 10, 2012.

(51) Int. Cl.
   H01L 21/44   (2006.01)
   H01L 29/40   (2006.01)
   (Continued)

(52) U.S. Cl.
   CPC ...... H01L 29/401 (2013.01); H01L 29/42316 (2013.01); H01L 29/475 (2013.01);
   (Continued)

(58) Field of Classification Search
   CPC .................... H01L 29/401; H01L 29/42316
   (Continued)

(56) References Cited

U.S. PATENT DOCUMENTS 3,523,224 A * 8/1970 Randall, Jr. ............ H01G 4/008
                                                                    361/305
4,582,564 A * 4/1986 Shanefield ............ H05K 3/386
                                                                 204/192.36
(Continued)

OTHER PUBLICATIONS

Quayle Action for U.S. Appl. No. 14/627,340, dated Jul. 6, 2015, 5 pages.

(Continued)

*Primary Examiner* — Bradley K Smith
(74) *Attorney, Agent, or Firm* — Withrow & Terranova, P.L.L.C.

(57) ABSTRACT

A method for fabricating a metal structure for a semiconductor device is disclosed. The method begins with providing a wafer with a current input contact and current output contact. Remaining steps include loading the wafer into a deposition apparatus, depositing a layer of metal onto a predefined metal region, removing the wafer from the deposition apparatus, and performing an ex-situ passivation process. If additional layers are to be deposited and passivated, the steps are repeated until a predetermined number of layers of metal are deposited onto the predefined metal region. The predefined metal region is a gate metal opening if the metal structure is a gate contact for a field effect transistor. The ex-situ passivation process is achievable through oxidation or nitridation of the wafer using either oxygen plasma or a nitrogen plasma, respectively. Alternately, oxidation is also achievable through exposing the wafer to air at an elevated temperature.

11 Claims, 3 Drawing Sheets

(51) Int. Cl.
    *H01L 29/423* (2006.01)
    *H01L 29/47* (2006.01)
    *H01L 29/66* (2006.01)
    *H01L 29/778* (2006.01)
    *H01L 29/812* (2006.01)
    *H01L 29/20* (2006.01)

(52) U.S. Cl.
    CPC .... *H01L 29/66462* (2013.01); *H01L 29/7787* (2013.01); *H01L 29/812* (2013.01); *H01L 29/2003* (2013.01); *H01L 29/42376* (2013.01)

(58) Field of Classification Search
    USPC .......................................................... 438/572
    See application file for complete search history.

(56) References Cited

U.S. PATENT DOCUMENTS

| | | | | |
|---|---|---|---|---|
| 5,597,738 A | * | 1/1997 | Kurtz | H01L 21/76264 148/DIG. 150 |
| 2004/0038466 A1 | * | 2/2004 | Yen | H01L 21/28194 438/197 |
| 2007/0128736 A1 | * | 6/2007 | Chang | H01L 21/28079 438/3 |
| 2007/0295993 A1 | * | 12/2007 | Chen | H01L 29/2003 257/194 |
| 2009/0057720 A1 | | 3/2009 | Kaneko | |
| 2009/0108254 A1 | * | 4/2009 | Lee | H01L 51/105 257/40 |
| 2010/0078684 A1 | | 4/2010 | Rachmady et al. | |
| 2010/0244018 A1 | | 9/2010 | Kaneko | |
| 2011/0062438 A1 | | 3/2011 | Kaneko | |
| 2011/0227089 A1 | | 9/2011 | Mieczkowski et al. | |
| 2011/0233538 A1 | | 9/2011 | Iwakami et al. | |
| 2011/0278590 A1 | | 11/2011 | Mieczkowski et al. | |

OTHER PUBLICATIONS

Non-Final Office Action for U.S. Appl. No. 14/627,340, dated Jan. 13, 2016, 9 pages.

Notice of Allowance for U.S. Appl. No. 14/627,340, dated Aug. 17, 2016, 5 pages.

* cited by examiner

METHODS FOR FABRICATING A METAL STRUCTURE FOR A SEMICONDUCTOR DEVICE

RELATED APPLICATIONS

The present application claims the benefit of U.S. provisional patent application No. 61/622,065, filed Apr. 10, 2012, the disclosure of which is incorporated herein by reference in its entirety.

FIELD OF THE DISCLOSURE

The present disclosure relates to fabricating semiconductor devices and, in particular, to fabricating metal structures such as rectifying contacts for semiconductor devices.

BACKGROUND

During fabrication of a semiconductor device such as a gallium nitride (GaN) high electron mobility transistor (HEMT), a transition metal such as nickel (Ni) is deposited as a layer of the semiconductor device to realize a Schottky barrier. The Schottky barrier is an energy barrier that provides a rectifying function used to prevent unwanted leakage current from passing through a junction region of the semiconductor device. A thicker noble metal layer for carrying a relatively large current at low resistance is typically deposited over the layer making up the Schottky barrier. However, when a transition metal such as Ni is used as a Schottky contact metal, an intervening layer of a noble metal such as platinum (Pt) or palladium (Pd) is also deposited to form a diffusion barrier layer. Alternately, diffusion layers have been fabricated using an in-situ oxidation process that oxidizes a transition metal during deposition. These diffusion layers and the other layers of metal making up a metal structure for a semiconductor device are generally deposited in a vacuum chamber by thermal evaporation, e-beam evaporation or sputtering. As such, the in-situ oxidation process requires expensive modifications of tools and/or complicated modifications of other processes. Thus, a new process for fabricating a metal structure for a semiconductor device is needed to avoid expensive modifications of tools and/or complicated modifications of other processes.

SUMMARY

A method for fabricating a metal structure for a semiconductor device is disclosed. The method begins with providing a wafer with a current input contact and current output contact. Remaining steps include loading the wafer into a deposition apparatus, depositing a layer of metal onto a predefined metal region, removing the wafer from the deposition apparatus, and performing an ex-situ passivation process. If additional layers are to be deposited and passivated, the steps are repeated until a predetermined number of layers of metal are deposited onto the predefined metal region.

In at least one embodiment, the metal structure is a gate contact for a field effect transistor and the predefined metal region is a gate metal opening. The ex-situ passivation process is achievable through oxidation or nitridation of the wafer using either oxygen plasma or a nitrogen plasma, respectively. Alternately, oxidation is also achievable through exposing the wafer to air at an elevated temperature. Exemplary semiconductor devices that can have metal structures fabricated using the disclosed method can be, but are not limited to, Schottky diodes, gallium nitride (GaN) high electron mobility transistors (HEMTs), metal semiconductor field effect transistors (MESFETs), and heterostructure field effect transistors (HFETs).

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
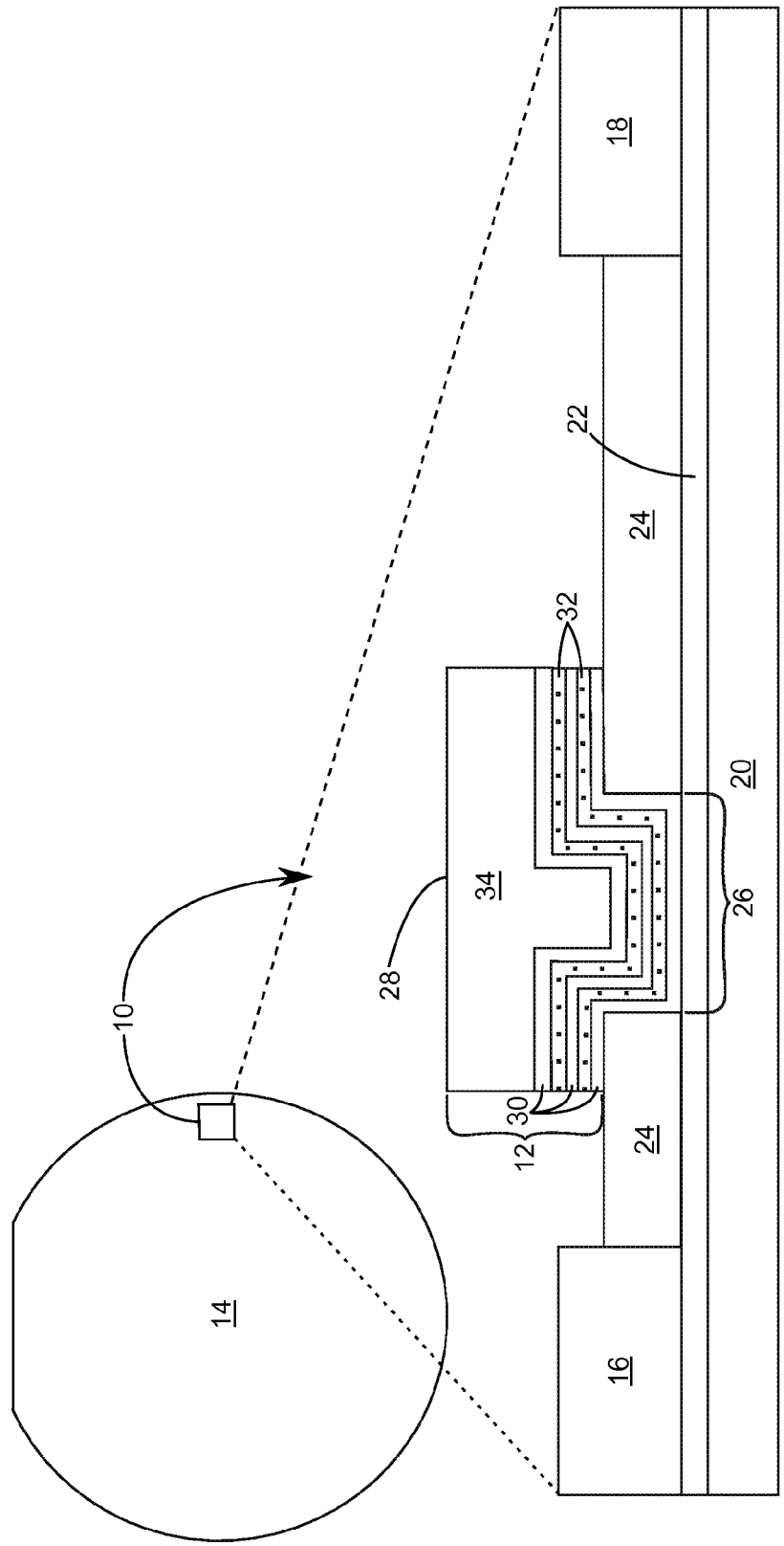
FIG. 1 is a cross-sectional diagram of a semiconductor device with an exemplary metal structure fabricated in accordance with methods of the present disclosure.

FIG. 1 is a cross-sectional diagram of an exemplary semiconductor device 10 having a metal structure 12 fabricated in accordance with methods of the present disclosure. The semiconductor device 10 is typically fabricated on a wafer 14. The semiconductor device 10 includes a source contact 16 and a drain contact 18. A substrate 20 carries a device layer 22 that in an exemplary case is made of aluminum gallium nitride (AlGaN)/GaN. A dielectric layer 24 is deposited over the device layer 22. Typically, the dielectric layer 24 is made of silicon nitride ($Si_3N_4$). A gate metal opening 26 for a gate 28 is etched in the dielectric layer 24. A plurality of diffusion barrier layers are made of metal layers 30 and metal oxide layers 32. The metal layers are typically transition metals such as, but not limited to, nickel (Ni), titanium (Ti), chromium (Cr), tantalum (Ta), and aluminum (Al). Transition metals are typically relatively easier to oxidize and nitridize than other metals. Therefore, in at least one embodiment, the metal oxide layers 32 are made of nickel oxide (NiO). A noble metal such as gold (Au) makes up a current carrying metal layer, which in the case of the semiconductor device 10 is usable as a gate contact 34.

Figure 2:
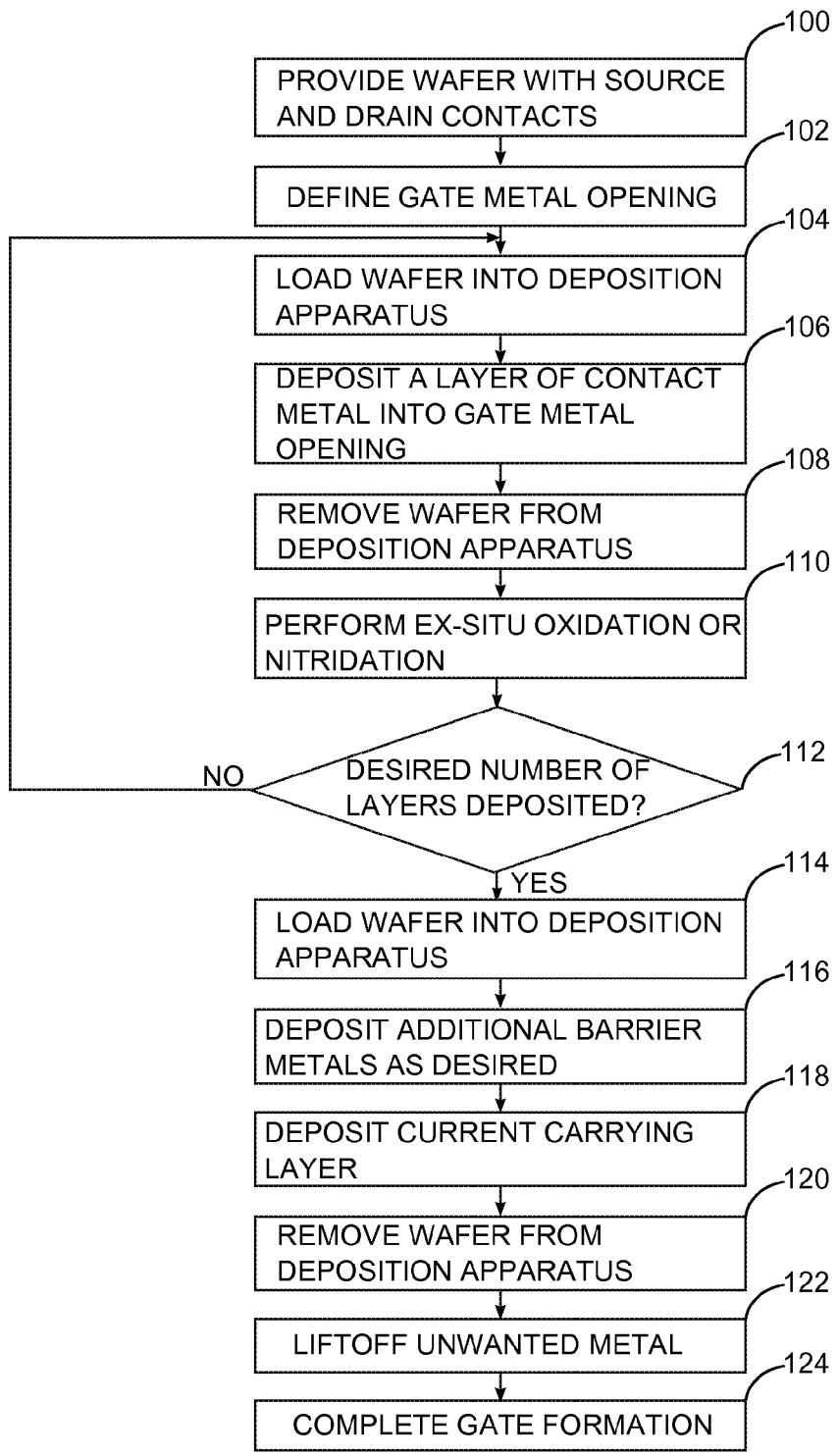
FIG. 2 is a process diagram for one embodiment of a method for fabricating the exemplary metal structure for the semiconductor device of FIG. 1.

FIG. 2 is a process diagram for one embodiment of a method for fabricating the exemplary metal structure for the semiconductor device of FIG. 1. The method begins by providing the wafer 14 with the source contact 16 and the drain contact 18 preformed (step 100). A next step is defining a predetermined metal region such as the gate metal opening 26 (step 102). A photolithographic technique is typically used for defining the gate metal opening 26. The process continues by loading the wafer 14 into a deposition apparatus, including evacuating practically all gas from the deposition apparatus (step 104). The typical deposition apparatus used in the disclosed process includes a vacuum chamber that can be evacuated using a single pump down operation. Examples of suitable deposition apparatuses include thermal evaporators, electron beam (e-beam) evaporators or sputter equipment that uses continuous deposition. A next step includes depositing a layer of metal in the predefined metal region, which in this exemplary case is the gate metal opening 26 (step 106). In one embodiment, the deposited layer of metal such as one of the metal layers 30 is relatively thin, ranging from around about 30 Angstroms to less than 49 Angstroms. In another embodiment, the deposited layer of metal such as one of the metal layers 30 ranges in thickness from around about 49 Angstroms to around about 100 Angstroms. Another step involves removing the wafer 14 from the deposition apparatus, which includes breaking the vacuum of the deposition apparatus (step 108). A following step comprises performing an ex-situ passivation of the wafer 14 (step 110). The ex-situ passivation is either an oxidation or nitridation of the metal making up the metal layers 30. In one embodiment, the oxidation is accomplished by exposing the wafer 14 to oxygen plasma via an oxygen plasma device. In another embodiment, the nitridation is accomplished by exposing the wafer 14 to nitrogen plasma via a nitrogen plasma device. Alternately, the oxidation can be accomplished by exposing the wafer 14 to air at an elevated temperature that is above ambient temperature.

The steps 104 through 110 are repeated until a desired number of the metal layers 30 is deposited (step 112). Once the desired number of metal layers 30 is deposited, the process continues with loading the wafer 14 into the deposition apparatus and reestablishing a vacuum (step 114). Once the vacuum is reestablished, the process continues by depositing additional barrier metals as desired (step 116). A next step is completed by depositing a current carrying layer, which is the gate contact 34 in the case of exemplary semiconductor device 10 (step 118). Remaining steps include removing the wafer 14 from the deposition apparatus, performing a liftoff of unwanted metal and completing the formation of the gate 28, (step 120), (step 122), and (step 124), respectively.

Figure 3:
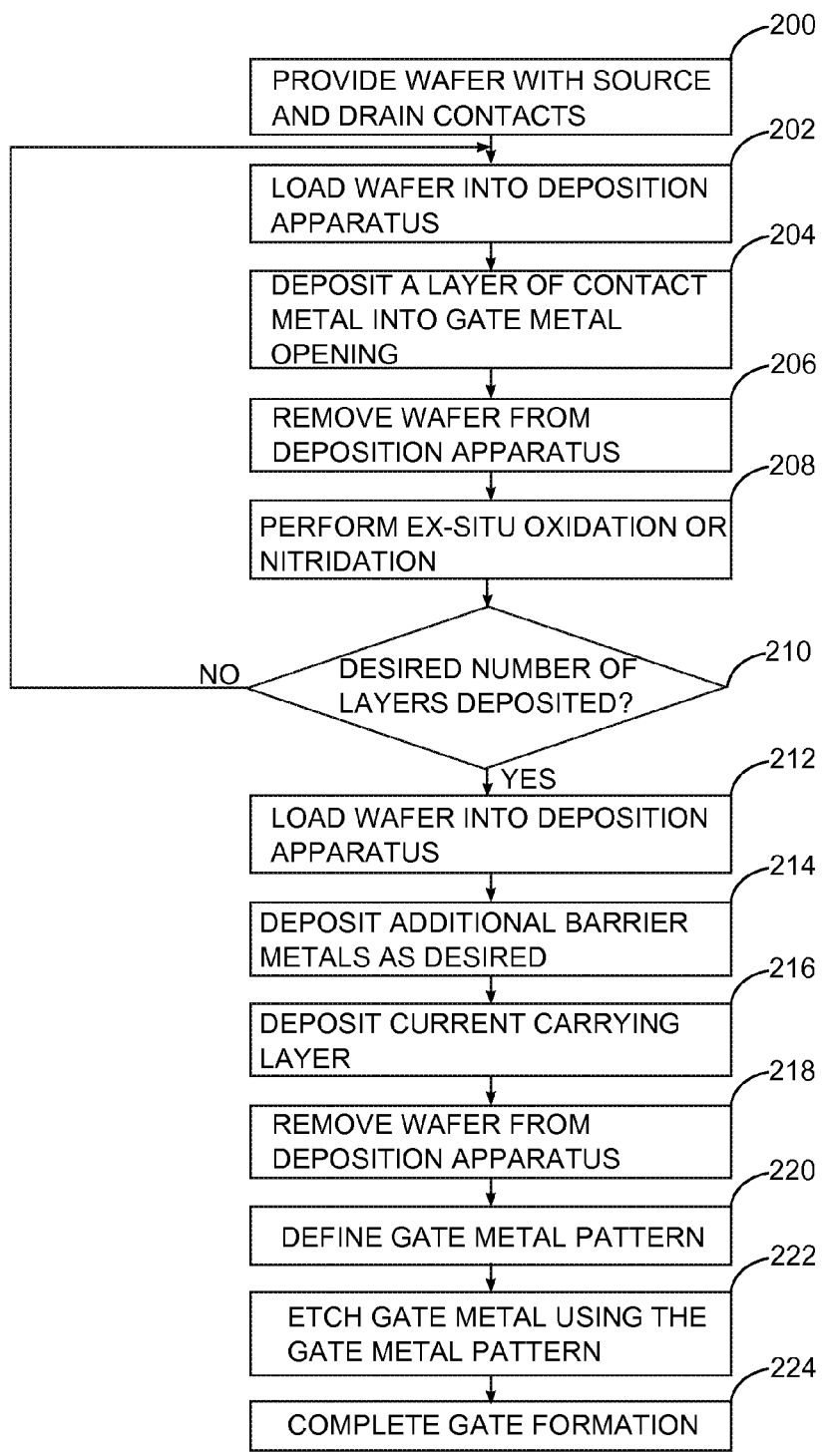
FIG. 3 is a process diagram for another embodiment of a method for fabricating the exemplary metal structure for the semiconductor device of FIG. 1.

FIG. 3 is a process diagram for another embodiment of a method for fabricating the exemplary metal structure for the semiconductor device of FIG. 1. The method begins by providing the wafer 14 with the source contact 16 and the drain contact 18 preformed (step 200). The process continues by loading the wafer 14 into a deposition apparatus, including evacuating practically all gas from the deposition apparatus (step 202). A next step comprises depositing a layer of metal in the predefined metal region, which in this exemplary case is the gate metal opening 26 (step 204). The deposited layer of metal such as one of the metal layers 30 is relatively thin ranging between about 30 Angstroms to near 49 Angstroms. Another step involves removing the wafer 14 from the deposition apparatus, which includes breaking the vacuum of the deposition apparatus (step 206). A following step comprises performing an ex-situ passivation of the wafer 14 (step 208). The ex-situ passivation is either an oxidation or nitridation of the metal making up the metal layers 30. Like the method disclosed by FIG. 2, the oxidation is accomplished by exposing the wafer 14 to oxygen plasma via an oxygen plasma device. Moreover, the nitridation is accomplished by exposing the wafer 14 to nitrogen plasma via a nitrogen plasma device. Alternately and similar to the method disclosed by FIG. 2, the oxidation can be accomplished by exposing the wafer 14 to air at an elevated temperature that is above ambient temperature.

The steps 202 through 208 are repeated until a desired number of the metal layers 30 is deposited (step 210). Once the desired number of metal layers 30 is deposited, the process continues with loading the wafer 14 into the deposition apparatus and reestablishing a vacuum (step 212). Once the vacuum is reestablished, the process continues by depositing additional barrier metals as desired (step 214). A next step is completed by depositing a current carrying layer, which is the gate contact 34 in the case of exemplary semiconductor device 10 (step 216). The process typically continues by removing the wafer 14 from the deposition apparatus (step 218). Remaining steps include defining a gate metal pattern, etching the gate metal using the gate metal pattern, and then completing the formation of the gate 28 via (step 220), (step 222), and (step 224), respectively.

Either of the methods disclosed in the process diagrams of FIGS. 2 and 3 results in a few monolayers of non-crystalline oxides or nitrides that are formed on the surface of deposited transition metals. In the exemplary semiconductor device 10, the metal oxide layers 32 (FIG. 1) are sandwiched between the metal layers 30. As such, the presently disclosed ex-situ methods reduces gate leakage current by at least ten times over a transition metal/noble metal deposition used by typical metal structure fabrication processes.

Those skilled in the art will recognize improvements and modifications to the embodiments of the present disclosure. All such improvements and modifications are considered within the scope of the concepts disclosed herein and the claims that follow.

What is claimed is:

1. A method for fabricating a metal structure for a field effect device (FED) comprising:
   providing the FED with a gate recess over a substrate;
   forming a gate comprising the steps of:
      subjecting the FED to a vacuum;
      depositing under the vacuum a first metal layer extending into and covering a bottom portion of the gate recess, wherein the first metal layer is formed from a metal selected from a group consisting of nickel (Ni), titanium (Ti), chromium (Cr), tantalum (Ta), and aluminum (Al);

removing the FED from the vacuum;
forming a first passivation layer by oxidizing a top surface of the first metal layer, wherein oxidizing the top surface of the first metal layer is accomplished by exposure to oxygen plasma while the FED is ex-situ and not under vacuum;
subjecting the FED to the vacuum;
depositing under vacuum a second metal layer over the first passivation layer, wherein the second metal layer is formed from a metal selected from a group consisting of nickel (Ni), titanium (Ti), chromium (Cr), tantalum (Ta), and aluminum (Al); and
depositing under vacuum a current carrying layer over the second metal layer.

2. The method of claim 1 wherein the first metal layer forms a Schottky metal contact region.

3. The method of claim 1 wherein the current carrying layer is formed from a noble metal.

4. The method of claim 1 further including depositing additional metal layers formed from metals selected from a group consisting of nickel (Ni), titanium (Ti), chromium (Cr), tantalum (Ta), and aluminum (Al) prior to depositing the current carrying layer.

5. The method of claim 1 further including performing a liftoff of unwanted metal.

6. The method of claim 1 further including:
defining a gate metal pattern; and
etching a gate metal structure using the gate metal pattern.

7. The method of claim 1 wherein each of the first metal layer and the second metal layer is deposited with a thickness that ranges from around about 30 Angstroms to less than 49 Angstroms.

8. The method of claim 1 wherein the FED is a gallium nitride (GaN) high electron mobility transistor (HEMT).

9. The method of claim 1 wherein the FED is a metal semiconductor field effect transistor (MESFET).

10. The method of claim 1 wherein the FED is a heterostructure field effect transistor (HFET).

11. The method of claim 1 further including adding a second passivation layer over the second metal layer.

\* \* \* \* \*